(12) United States Patent
Moffatt

(10) Patent No.: US 9,762,021 B2
(45) Date of Patent: Sep. 12, 2017

(54) BROADBAND LASER SOURCE FOR LASER THERMAL PROCESSING AND PHOTONICALLY ACTIVATED PROCESSES

(71) Applicant: Applied Materials, Inc., Santa Clara, CA (US)

(72) Inventor: Stephen Moffatt, St. Brelade (JE)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/857,975

(22) Filed: Sep. 18, 2015

(65) Prior Publication Data

US 2016/0013610 A1  Jan. 14, 2016

Related U.S. Application Data

(63) Continuation of application No. 13/674,319, filed on Nov. 12, 2012, now abandoned.
(Continued)

(51) Int. Cl.
*H01S 3/10* (2006.01)
*H01S 3/08* (2006.01)
(Continued)

(52) U.S. Cl.
CPC .......... *H01S 3/10092* (2013.01); *H01S 3/091* (2013.01); *H01S 3/10007* (2013.01); *H01S 3/10015* (2013.01); *H01S 3/10038* (2013.01); *H01S 3/11* (2013.01); *H01S 3/163* (2013.01); H01S 3/0602 (2013.01); H01S 3/08086 (2013.01); H01S 3/10084 (2013.01); H01S 3/1611 (2013.01); H01S 3/1643 (2013.01); H01S 3/2375 (2013.01); H01S 5/0622 (2013.01)

(58) Field of Classification Search
CPC ........ H01S 3/10092; H01S 3/091; H01S 3/11; H01S 3/163; H01S 3/10015; H01S 3/10038; H01S 3/10007; H01S 5/0622; H01S 3/2375; H01S 3/10084; H01S 3/1611; H01S 3/0602; H01S 3/1643; H01S 3/08086
See application file for complete search history.

(56) References Cited

U.S. PATENT DOCUMENTS 5,291,265 A * 3/1994 Kebabian ............... G01N 21/05
                                                     250/343
5,978,528 A * 11/1999 Fidric ..................... H01S 3/005
                                                     385/24
(Continued)

OTHER PUBLICATIONS

International Search Report and Written Opinion for PCT/US2012/064638, dated Mar. 26, 2013.
(Continued)

*Primary Examiner* — Yuanda Zhang
(74) *Attorney, Agent, or Firm* — Patterson + Sheridan LLP

(57) ABSTRACT

A laser that emits light at all available frequencies distributed throughout the spectral bandwidth or emission bandwidth of the laser in a single pulse or pulse train is disclosed. The laser is pumped or seeded with photons having frequencies distributed throughout the superunitary gain bandwidth of the gain medium. The source of photons is a frequency modulated photon source, and the frequency modulation is controlled to occur in one or more cycles timed to occur within a time scale for pulsing the laser.

9 Claims, 3 Drawing Sheets

Related U.S. Application Data

(60) Provisional application No. 61/561,469, filed on Nov. 18, 2011.

(51) Int. Cl.
  H01S 3/091 (2006.01)
  H01S 3/11 (2006.01)
  H01S 3/16 (2006.01)
  H01S 3/23 (2006.01)
  H01S 5/062 (2006.01)
  H01S 3/06 (2006.01)

(56) References Cited

U.S. PATENT DOCUMENTS

| | | |
|---|---|---|
| 6,952,435 B2 | 10/2005 | Lai et al. |
| 7,016,103 B2 | 3/2006 | Paschotta et al. |
| 2003/0174938 A1 | 9/2003 | Headley et al. |
| 2004/0105143 A1 | 6/2004 | Lin et al. |
| 2005/0041702 A1 | 2/2005 | Fermann et al. |
| 2006/0268950 A1* | 11/2006 | Kane .................. H01S 3/10092 372/30 |
| 2008/0267226 A1 | 10/2008 | Liaw et al. |
| 2009/0231681 A1* | 9/2009 | Du .......................... G02B 6/272 359/334 |
| 2009/0274181 A1* | 11/2009 | Akahane ................ H01S 3/2308 372/25 |
| 2009/0285245 A1* | 11/2009 | Liu ....................... H01S 3/0057 372/6 |
| 2010/0054284 A1* | 3/2010 | Dekker ................ H01S 3/1086 372/3 |
| 2012/0002689 A1* | 1/2012 | Wojcik ..................... G02F 1/39 372/28 |

OTHER PUBLICATIONS

Schultz, "Fast Electro-Optic Wavelength Selection and Frequency Modulation in Solid State Lasers," The Lincoln Laboratory Journal, vol. 3, No. 3, 1990, pp. 463-478.

Redding, et al., "Spatial coherence of random laser emission", Optics Letters, vol. 36, No. 17, Sep. 1, 2011, pp. 3404-3406.

Selvas, et al., "Wavelength tuning of fiber lasers using multimode interference effects", Optics Express, vol. 13, No. 23, Nov. 14, 2005, pp. 9439-9445.

Office Action for Taiwan Application No. 101142407 dated Jan. 12, 2017.

Office Action and Search Report for Taiwan Application No. 101142407 dated Jun. 17, 2016.

* cited by examiner

BROADBAND LASER SOURCE FOR LASER THERMAL PROCESSING AND PHOTONICALLY ACTIVATED PROCESSES

CROSS-REFERENCE TO RELATED APPLICATIONS

This is a continuation of copending U.S. patent application Ser. No. 13/674,319, which claims benefit of U.S. provisional patent application Ser. No. 61/561,469, filed Nov. 18, 2011, each of which is herein incorporated by reference.

FIELD

Embodiments of the invention relate to thermal processing apparatus and methods. More specifically, disclosed embodiments relate to high power, low coherence light sources, and their use in thermal processing applications such as semiconductor manufacturing.

BACKGROUND

Thermal treatment is a process commonly used in semiconductor manufacturing processes such as logic and storage and in magnetic media manufacturing processes. A substrate is subjected to a programmed heat history to achieve a thermally induced transformation of the material from one state to another. In semiconductor processing, an example is thermally treating a substrate to increase the crystallinity or overall organization of the substrate material. Processes commonly used for thermal treatment include furnace baking, various types of rapid thermal processing, spike annealing and laser processing.

In advanced applications featuring very thin films and/or small critical dimensions, the thermal treatment typically delivers a desired energy dose to the substrate in a very short period of time to avoid undesirable effects from lengthy exposure to thermal energy, such as deep penetration of thermal energy into the substrate and the resulting disruption of underlying layers. Laser processing is commonly selected to access the high power needed for very short processing times.

In laser thermal treatment, a laser beam is directed to a treatment area of a substrate. The radiation field developed by a typical laser has a non-uniform intensity profile. In cross-section, the radiation field has regions of high intensity and regions of low intensity. This non-uniformity results in non-uniform processing of the treatment area, with some parts of the treatment area receiving more energy and some receiving less. These non-uniformities may be quite large, approaching 100% in some cases.

Causes of the non-uniform intensity profile of laser beams are well-known. Lasers are optical oscillators that develop a standing oscillation of energy within the optical cavity of the laser. The standing oscillation is a wave-form having maxima and minima that are realized in the emitted laser beam as modes. These modes may have a spatial component (e.g. maxima and minima distributed across the three-dimensions of space) and/or a temporal component (e.g. maxima and minima that change with time). Additionally, the wave-forms developed in the optical cavity of the laser exhibit interference effects that contribute to the non-uniformity of the emitted energy. Sometimes, these interference effects are called "speckle". The strongly coherent nature of laser light is uniquely pre-disposed to such interference effects.

Many approaches have been used to address the various manifestations of non-uniformity in laser fields over many decades. In general, the laser beam is subjected to refractive and reflective transformations to blend and/or de-image the modes. Such transformations typically rely on highly designed, expensive optical elements. As device specifications become increasingly demanding, more precise and uniform manufacturing methods are needed. Redesigning optics for each new technology node becomes cost prohibitive. Thus, there is a need in the art for a laser capable of forming an energy field subject to minimal non-uniformity.

SUMMARY

A laser that emits light at a plurality of frequencies distributed throughout the spectral bandwidth of the laser in a single pulse or pulse train is disclosed. The laser is pumped or seeded with photons having frequencies distributed throughout the superunitary gain bandwidth of the gain medium. The source of photons is a frequency modulated photon source, and the frequency modulation is controlled to occur in one or more cycles timed to occur within a time scale for pulsing the laser.

Methods of producing broadband laser pulses include seeding a gain medium with photons from a suitably long fiber laser or a tunable laser frequency-cycled over a time scale similar to, or shorter than, the time scale of the pulses. The output of a pulsed fiber laser having a relatively long fiber to create significant chromatic dispersion may be directed into a gain medium having a superunitary gain bandwidth matched to the spectral bandwidth of the fiber laser. The gain medium will produce a pulse of photons having substantially all available frequencies within the spectral bandwidth of the gain medium.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
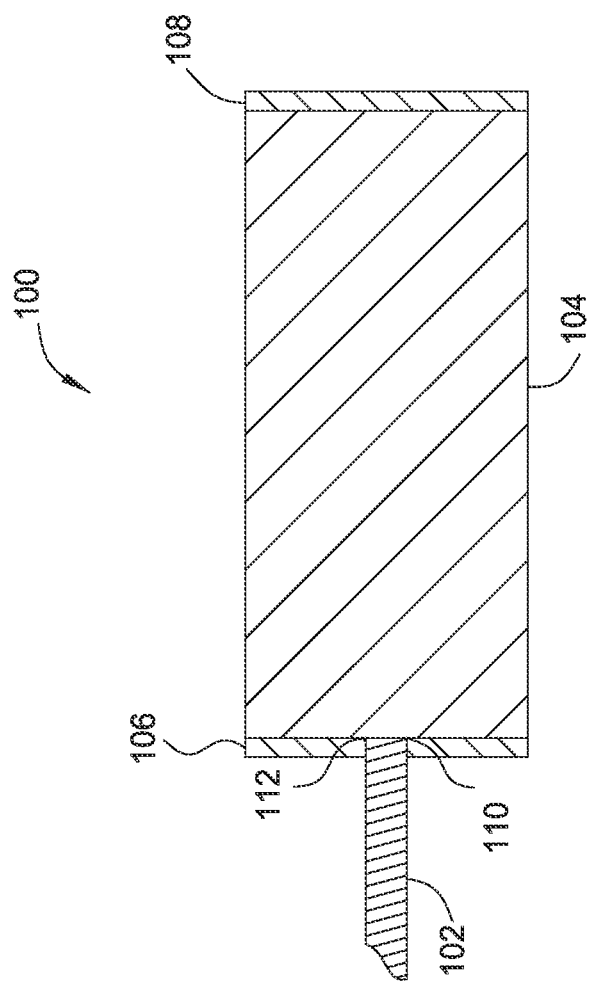
FIG. 1 is a side view of a laser apparatus according to one embodiment.

A broadband optical amplifier is described below. The broadband optical amplifier generally produces high power radiation that has a relatively broad distribution of frequencies giving rise to a short coherence length. The resulting radiation field emitted by the amplifier has a highly uniform natural energy distribution prior to any optical treatment.

Conventional lasers typically rely on quantum noise to seed initial emission after charging by flash lamp or laser. The gain medium has a geometry that can amplify only certain frequencies of light. The initial emission due to quantum noise results in a photon having a frequency that resonates within the gain medium. The frequency of the initial emission is amplified by stimulated emission such that the laser emits light at essentially a single frequency.

The quantum noise may result in multiple spontaneous emissions with different frequencies that are in the range of frequencies the gain medium can amplify. Such spontaneous emissions give rise to stimulated emissions that may have a plurality of frequencies, but the noise is typically not distributed across the emission spectrum or the gain spectrum of the medium, so photons are emitted at a range of frequencies that is a subset of the frequencies the gain bandwidth or emission spectrum of the medium. The superunitary gain bandwidth or gain spectrum is the range of frequencies that a laser will emit with intensity greater than that of an input pulse.

In some cases, the range of frequencies is quite narrow, giving rise to essentially single-frequency emission. The narrow frequency distribution of the emitted photons results in high coherency, large interference parameters, and significant energy non-uniformity. By seeding most or all available resonating emission modes or frequencies of the broadband optical amplifier, the output frequency distribution is broadened substantially, the coherence length is shortened, interference is reduced, and uniformity improved.

The broadband optical amplifier may be a laser or a collection of optical amplification cells that do not oscillate. The amplifier includes one or more amplification media that absorb light in an absorption band of frequencies and emit light in an emission band of frequencies. The amplification media are charged by irradiating with light in the absorption band, and then seeded with a source of photons having frequencies across the emission band of the media. For laser embodiments, the seed photons are typically provided at frequencies across the superunitary gain band of the media, or medium. The source of seed photons is operable to emit a pulse of photons having a distribution of quantum states substantially matched to the full range of quantum states the amplifier can emit The emitted photons have the broadest possible spectral bandwidth for a given device. In a non-laser embodiment, for example a train of unmirrored amplifiers, the emitted photons have a frequency distribution substantially similar, or identical, to the emission band of the media. In a laser embodiment, the emitted photons have a frequency distribution substantially similar, or identical, to the superunitary gain band of the gain medium. Emitting photons having a relatively broad spectral bandwidth minimizes coherence of the emitted energy and the opportunity for speckle. The emitted energy has non-uniformity close to a theoretical minimum and requires less optical transformation to achieve any desired uniformity at the substrate surface.

FIG. 1 is a side view of a broadband optical amplifier assembly 100 operable to emit photons across the entire spectral bandwidth of the amplifier medium. The broadband optical amplifier assembly 100 is a laser, wherein a frequency modulated seed photon source 102 is coupled to a gain medium 104 positioned between a full reflector 106 and a partial reflector 108. The frequency modulated photon source 102 is operable to emit photons having a plurality of frequencies distributed throughout the superunitary gain bandwidth of the gain medium 104. In this application, the term "superunitary gain bandwidth" refers to the collection of frequencies that the gain medium 104 will amplify with gain greater than 1.0. This collection of frequencies may also be termed the "lasing bandwidth" of the gain medium 104. The gain medium 104 may be any standard lasing medium, such as a doped yttrium aluminum garnet, sapphire, beryl, emerald, ruby, yttrium vanadate, yttrium lithium fluoride, glass, or other crystal. Dopants are usually rare earth or transition metal atoms such as erbium, neodymium, ytterbium, europium, chromium, and the like. Gas lasers, dye lasers, and diode lasers may also be configured to accept a range of input frequencies across their gain bandwidths.

The frequency modulated photon source 102 may be a tunable wavelength laser, a chirped laser, or a broadband emitter having an emission spectrum that includes all or most of the superunitary gain band of the gain medium 104. In the embodiment of FIG. 1, the frequency modulated photon source 102 is a pulsed fiber laser. A tunable wavelength laser may be frequency modulated by varying a property that affects the wavefunction of photons emitted by the laser. The frequency is generally varied at a rate comparable to the duration of pulses emitted by the laser, so that a single pulse contains substantially all the frequencies the laser can emit. In the case of a fiber laser, the fiber may be made of a material with chromatic dispersion, which is strong dependence of refractive index on frequency, or polarization dispersion, which is strong dependence of refractive index on polarization state. Chromatic dispersion in a fiber laser results in a spreading of the emitted laser pulse, with longer wavelengths emerging before shorter wavelengths. The resulting pulse has a substantially continuous increasing wavelength from front to back, which is called "upward chirp". Fiber lasers having an opposite dependency of refractive index on frequency may emit a pulse having a "downward chirp".

Tunable lasers may vary the emitted frequency by varying temperature or pressure of the gain medium. Very fast frequency modulation of a tunable laser, for example cycling the frequency over a duration less than about 10 nsec, may be achieved using a piezoelectric component such as quartz disposed about the laser in a manner that allows pressure to be applied to the gain medium. In one embodiment, the piezoelectric material may be disposed in a thin layer at one or more ends of the optical cavity of a laser diode. Voltage can then be cycled across the piezoelectric material at a frequency above about 1 GHz to achieve very fast frequency modulation by stress cycling the laser diode. Such frequency-cycling may be tuned by adjusting the amplitude of the voltage cycle, and in some cases a resonant frequency may be designed into the piezoelectric material to produce a magnified stress cycle and frequency cycle in the laser diode.

The partial reflector 108 is a standard component, and the full reflector 106 may be curved, and may have an aperture 110 for admitting light from the frequency modulated seed photon source 102. Each of the partial reflector 108 and the full reflector 106 may be a metal mirror, a dielectric mirror, or a Bragg mirror. The frequency modulated seed photon source 102 is shown positioned proximate the aperture 110 in the full reflector 106 such that photons are emitted from an emitting end 112 of the frequency modulated seed photon source 102 and through the aperture 110 into the gain medium 104. The frequency modulated seed photon source 102 is operable to emit a pulse of photons having a specific time-dependent frequency distribution into the gain medium. In one embodiment, the frequency modulated seed photon source 102 is chirped, either upward or downward in a single pulse. The chirp traverses the frequency range of the superunitary gain bandwidth of the gain medium 104, such that photons are emitted by the chirped frequency modulated seed photon source 102 that stimulate emission of photons having multiple frequencies across the entire spectral bandwidth of the gain medium 104. The diversity of frequencies minimizes coherence length of the pulse of photons emitted from the gain medium 104 as a laser pulse. In one embodiment, a 20 fsec pulse at a nominal wavelength of 532 nm from a 10 cm Nd doped fiber laser may be pulsed through a previously charged Nd:YAG crystal to generate a broadband laser pulse from the Nd:YAG crystal. The superunitary gain bandwidth of a Nd:YAG gain medium is typically about 500 GHz, corresponding to a wavelength distribution of about 0.5 nm. If photons having a variety of frequencies within the 500 GHz gain bandwidth are inserted into a charged Nd:YAG crystal, a single pulse having frequencies across the 500 GHz bandwidth (e.g. photons of varying wavelength in the rang 532 nm±0.5 nm) may be output in a single pulse. Photons having such a frequency distribution will have the minimum coherence length possible for a laser pulse unaltered by subsequent optics. In the example above, the coherence length of the emitted pulse will be less than about 2 cm.

The gain medium 104 must be charged before stimulated emission can occur. Conventional lasers are charged, or pumped, using a source of photons in the absorption spectrum of the gain medium. The absorption spectrum is usually different from the emission spectrum, so conventional lasers are usually charged by a broad spectrum source, such as a flash lamp, that produces numerous photons in the absorption spectrum of the gain medium, but also produces some photons in the emission spectrum of the gain medium. The absorbed photons charge the laser, and the emission photons stimulate emission of photons from the charged atoms and ions of the gain medium, setting off the cascade that produces a pulse of laser light.

To maximize the availability of photons across the spectral bandwidth of the gain medium 104, a narrow spectrum source may be used to charge the gain medium. Use of a narrow spectrum source minimizes loss of excited states within the gain medium. Lasers are conventionally used as pumps for other lasers. In the embodiment of FIG. 1, a first laser may be used to charge the gain medium 104, and a second laser may be used to seed the amplification process, as described above. For a Nd:YAG gain medium, a diode laser or fiber laser emitting at about 808 nm will charge the medium, and a laser emitting at about 532 nm frequency modulated as described above, may be used to seed a pulse from the gain medium. The two lasers are typically pulsed in sequence with a delay between the pulses of about 1 msec to establish a population inversion in the gain medium.

Figure 2:
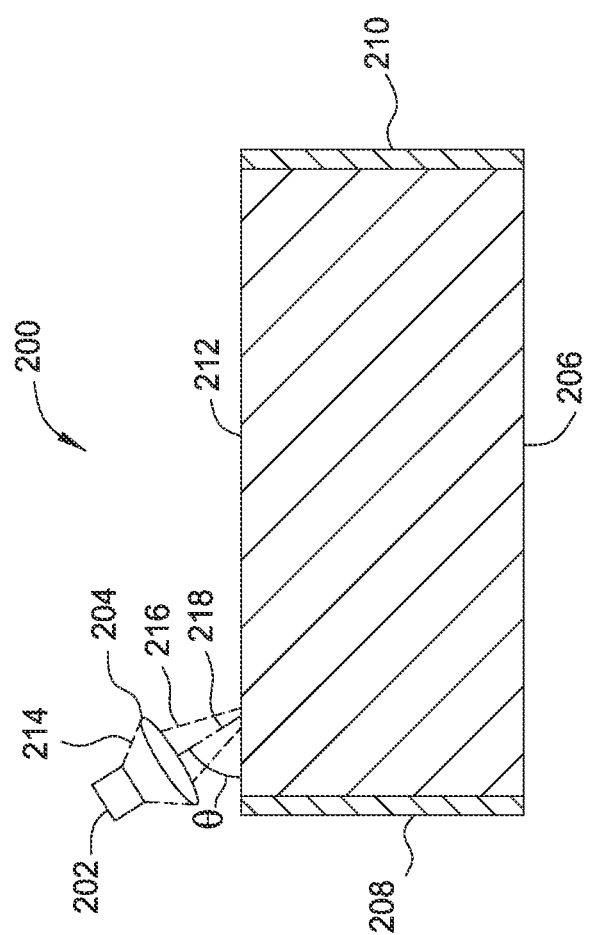
FIG. 2 is a side view of another embodiment of a laser apparatus.

FIG. 2 is a side view of an apparatus 200 according to another embodiment. The apparatus 200 is a broadband laser having a gain medium 206 between a full reflector 208 and a partial reflector 210. One or more tunable wavelength photon sources 202 is disposed proximate the gain medium 206 for injecting seed photons into the gain medium 206. In the embodiment of FIG. 2, the photon source 202 is shown as a highly divergent source, so a refractive element 204 is depicted with numerical aperture substantially matched to the divergence of the photon source 202. The photon source 202 may be a diode laser or diode laser array, and the refractive element 204 may be a lens, such as a focusing lens or a collimating lens.

Radiation from the photon source 202 passes through the refractive element 204 and is directed to a surface 212 of the gain medium 206 at an angle of incidence θ. The angle of incidence θ is selected for maximum penetration of photons into the gain medium 206 with minimum subsequent escape out of the gain medium 206 at a subsequent surface interaction. For example, the angle θ is greater than the critical angle of total reflection at the surface 212, but is typically less than 90°. Typically the angle of incidence is between about 60° and about 80°. In one embodiment, the radiation is frequency modulated 532 nm light from a quartz clad tunable diode laser at a driving frequency between about 500 MHz and about 3 GHz.

Figure 3:
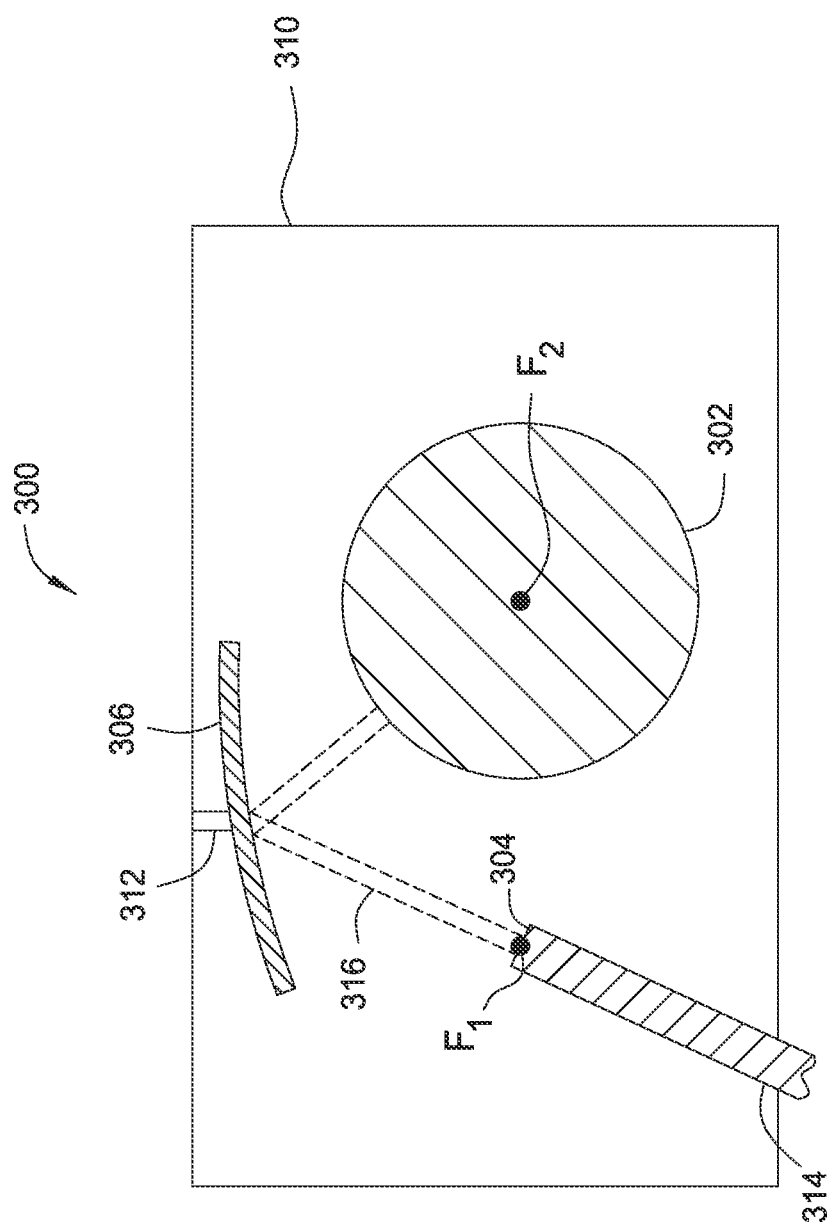
FIG. 3 is a side view of a third embodiment of a laser apparatus.

FIG. 3 is a side view of an apparatus 300 according to another embodiment. The apparatus 300 is a laser embodiment with a gain medium 302 positioned with an emitting end oriented pointing out of the page. In the apparatus 300, a light-emitting diode ("LED") 304 is disposed on a support 314 to emit photons inside an enclosure 310 towards a reflector 306. The photons are reflected toward a gain medium 302. The LED 304 emits photons at one focus $F_1$ of an ellipsoid, of which the reflector 306 is a part, such that the reflected photons focus at the second focus of the ellipsoid $F_2$. LED's typically have an emission band that is much broader than a superunitary gain band of an optical cavity made from a material emitting at the same frequency, so the photons emitted by the LED 304 have a frequency distribution that is much broader than the superunitary gain bandwidth of the gain medium 302. The gain medium 302 is positioned such that a centroid of the gain medium is at the second focus $F_2$ to maximize penetration of photons into the gain medium 302. The LED 304 is supported on a support 314 configured to place the LED at the first focus $F_1$. The support may protrude through a wall of the enclosure 310, as shown in FIG. 3. The reflector 306 is supported from a wall of the enclosure 310 by a support 312. The gain medium 302, in this embodiment a cylindrical rod, is typically supported by the walls of the enclosure 310 through which the gain medium 302 may protrude at both ends. Alternately, the gain medium 302 may protrude through a wall of the enclosure 310 at an emitting end of the gain medium 302, and a reflecting end of the gain medium 302 may be supported inside the enclosure 310 by a support (not shown). In another embodiment, the LED 304 may emit photons toward the centroid of the gain medium 302, and may be focused by a lens whose focal point is at the focus $F_2$ to maximize photon penetration into the gain medium 302. In another alternate embodiment, a fiber laser may replace the LED 304 for less divergent emissions toward the gain medium 302.

In all the embodiments described above, seed photons having a range of frequencies are used to amplify substantially all available gain frequencies of an amplifier medium. All available resonant frequencies of the gain medium may be amplified by seed photons having a range of frequencies across the gain spectrum of the medium. In some embodiments, all possible gain frequencies of the amplifier medium are amplified at substantially equal intensities or at a distribution of intensities with standard deviation less than about 50% of the average intensity. In some embodiments, the seed photons are evenly distributed throughout the superunitary gain bandwidth of the amplifier medium.

The embodiments of FIGS. 1-3 are all laser embodiments, where the gain medium is surrounded by reflectors. An alternate embodiment features gain media that are not surrounded by reflectors, such that the gain medium is not constrained to oscillate according to modes of the optical cavity. Such amplifiers emit a broader range of frequencies than lasers, but because photons do not make multiple passes through the gain medium, emitted power is lower. Multiple amplifiers may be arranged in optical series to compensate for the loss of power.

In other alternate embodiments, seed photons may be varied by polarization instead of, or in addition to, frequency to stimulate emission of photons from the amplifier that have reduced tendency to interfere, since photons having different polarization axes will interfere only as the cross-product of the polarization axes. Seed photons having a full range of polarization axes may be produced in a single pulse by pulsing a light source having frequencies in the emission band of the amplification medium, passing the emitted light through a wave plate to polarize the light, and then passing the polarized light through an electronic polarization rotator, such as a liquid crystal polarizer. The electronic polarization rotator can be cycled through the full range of polarization angles over a single pulse length by providing an alternating voltage at a frequency matching the desired cycle frequency. Photons passing through the electronic polarization rotator have their polarization axes rotated such that photons emitted by the amplifier medium in response have a full distribution of polarization states, and less tendency to interfere. In general, interference of radiation emitted by an optical amplifier may be reduced by seeding the amplifier with photons having a distribution of quantum states that substantially matches the distribution of quantum states that the amplifier can emit.

The combinations of gain media and seed photon sources shown in FIGS. 1-3 are intended to explain the ways of using various sources and methods of seeding, and are not intended to be limiting as to embodiments. Any of the seed photon sources of FIGS. 1-3, or any similarly broad seed photon sources suitably matched to the amplifier medium, may be used with any means for injecting the photons into the amplifier medium.

A method of processing a substrate includes extracting a high power pulse of radiant energy having a broad distribution of frequencies and/or polarization states from an emitting medium, increasing the energy uniformity of the pulse, shaping the pulse, and delivering the uniform, shaped pulse to a treatment area of the substrate. The pulse of radiant energy emitted by the emitting medium typically has a minimum coherence length available from the medium, corresponding to the spectral bandwidth of the medium. The emitter may be a laser or a plurality of amplifiers, and are typically seeded with photons having a frequency distribution covering substantially the entire emission band of the emitter. Seed photons for laser embodiments are typically distributed across the superunitary gain bandwidth of the laser. Such emitters are described above in connection with FIGS. 1-3.

Although the radiant energy emitted by the medium typically has a minimum coherence length, the energy may have spatial and temporal modes giving rise to unacceptable energy uniformity. The emitted energy may be divided into sub-pulses, and each sub-pulse imaged over the same area using a microlens array, if desired, to further reduce spatial non-uniformity. The emitted energy may also be divided into sub-pulses, each sub-pulse directed through a path having a different length, and the sub-pulses recombined to provide a "stretched" pulse, if desired, to optimize the temporal shape of the pulse for maximum absorption by the substrate. Such pulse shaping may also further reduce the effect of temporal modes if the difference in optical path length for any two sub-pulses is longer than the coherence length of the radiant energy.

The radiant energy may be shaped using an aperture. The aperture typically has a transmitting area and a reflecting area, and may include focusing features at the interface between the transmitting area and the reflecting area to produce a sharp edge to the energy field transmitted. Details of an optical system including elements similar to these, and methods of using them, are further described in U.S. patent application Ser. No. 13/194,552, filed Jul. 29, 2011.

While the foregoing is directed to embodiments of the invention, other and further embodiments of the invention may be devised without departing from the basic scope thereof.

What is claimed is:

1. A broadband optical amplifier assembly comprising:
a seed photon source;
a gain medium optically coupled to the seed photon source, wherein the seed photon source is operable to emit photons having a plurality of frequencies distributed throughout a superunitary gain bandwidth of the gain medium; and
one or more reflectors optically coupled to the gain medium, wherein:
at least one of the reflectors is a partial-ellipsoid reflector;
the seed photon source is a light-emitting diode positioned at a first focus of the partial-ellipsoid reflector; and
a centroid of the gain medium is at a second focus of the partial-ellipsoid reflector.

2. The broadband optical amplifier assembly of claim 1, wherein the broadband optical amplifier assembly is a laser.

3. The broadband optical amplifier assembly of claim 1, wherein the seed photon source is at least one of a frequency modulated source, a polarization modulated source, a tunable wavelength laser, a chirped laser, a pulsed fiber laser, a highly divergent source, a diode laser, a diode laser array, a light-emitting diode, and a broadband emitter having an emission spectrum that includes all of the superunitary gain band of the gain medium.

4. The broadband optical amplifier assembly of claim 1, wherein the plurality of frequencies of the emitted seed photons are evenly distributed throughout the superunitary gain bandwidth of the gain medium.

5. The broadband optical amplifier assembly of claim 1, wherein the broadband optical amplifier assembly is configured to emit pulses of photons having a short coherence length.

6. The broadband optical amplifier assembly of claim 5, wherein the coherence length is less than about 2 cm.

7. The broadband optical amplifier assembly of claim 1, wherein each of the reflectors is at least one of a metal mirror, a dielectric mirror, and a Bragg mirror.

8. The broadband optical amplifier assembly of claim 1, wherein the gain medium is positioned between two at-least-partial reflectors.

9. The broadband optical amplifier assembly of claim 8, wherein:
one of the at-least-partial reflectors is curved;
the curved reflector is a full reflector; and
the curved reflector has an aperture for admitting light from the seed photon source.

* * * * *